US005426341A

United States Patent [19]

Bory et al.

[11] Patent Number: 5,426,341

[45] Date of Patent: Jun. 20, 1995

[54] SONOTRODE FOR ULTRASONIC MACHINING DEVICE

[75] Inventors: Michael Bory; Hans Bauer, both of Wattwil, Switzerland

[73] Assignee: Durr Dental GmbH & Co. KG, Bietigheim-Bissingen, Germany

[21] Appl. No.: 139,025

[22] Filed: Oct. 21, 1993

[30] Foreign Application Priority Data

Oct. 21, 1992 [CH] Switzerland ..................... 3258/92

[51] Int. Cl.[6] ..................... H01L 41/08

[52] U.S. Cl. ..................... 310/323; 73/644

[58] Field of Search ..................... 310/26, 323; 74/155; 228/1.1; 73/644; 601/2; 73/644

[56] References Cited

U.S. PATENT DOCUMENTS

| | | | |
|---|---|---|---|
| 3,015,961 | 1/1962 | Roney | 74/155 |
| 3,058,218 | 10/1962 | Kleesattel et al. | 310/26 |
| 3,209,447 | 10/1965 | Jones | 310/26 |
| 3,696,259 | 10/1972 | Mori et al. . | |
| 3,926,357 | 12/1975 | Matrisian | 29/470.1 |
| 4,088,257 | 5/1982 | Devine | 228/110 |
| 4,596,352 | 6/1986 | Knapp | 228/1.1 |
| 4,842,671 | 6/1989 | Nuss | 156/433 |
| 5,159,838 | 11/1992 | Lynnworth | 73/644 |
| 5,238,170 | 8/1993 | Nuss | 228/1.1 |

FOREIGN PATENT DOCUMENTS

| | | | |
|---|---|---|---|
| 2415481 | 10/1974 | Germany | B06B 1/02 |
| 2445869 | 4/1976 | Germany | B06B 3/04 |
| 2711305 | 3/1977 | Germany | B06B 3/00 |
| 0229679 | 11/1985 | Japan | 310/323 |
| 2216223 | 4/1989 | United Kingdom | B06B 3/00 |

*Primary Examiner*—Thomas M. Dougherty
*Attorney, Agent, or Firm*—Sughrue, Mion, Zinn, Macpeak & Seas

[57] ABSTRACT

An annular sonotrode 5 vibrates at one of its natural frequencies, preferably about four nodes 33-36 equally distributed over its circumference. The vibrations introduced at the input 17 along axis 10 are outputted to a tool 6 along an axis 19 bent by 90°. With this design even difficult to access workpieces can be efficiently machined with ultrasonics.

6 Claims, 1 Drawing Sheet

SONOTRODE FOR ULTRASONIC MACHINING DEVICE

BACKGROUND OF THE INVENTION

Ultrasonic machining devices usually comprise a vibration exciter, for example, a piezoelectric vibration exciter, a coaxial sonotrode, and a tool that is also coaxial. The sonotrode is a rotationally symmetrical body and acts as a spring-mass system. By means of the vibration exciter the sonotrode is excited to longitudinal autooscillators, which form around a nodal surface. Frequently the sonotrode has on the input side a larger cross section than on the output side. Thus, it acts as an amplitude intensifier.

The known ultrasonic devices are relatively long in the axial direction of vibration, so that workpieces that are difficult to access are often hard to machine.

SUMMARY OF THE INVENTION

The present invention is based on the problem of providing a sonotrode which enables a shorter overall length in the direction of vibration of the tool.

DETAILED DESCRIPTION OF THE PREFERRED EMBODIMENTS

Figure 1:
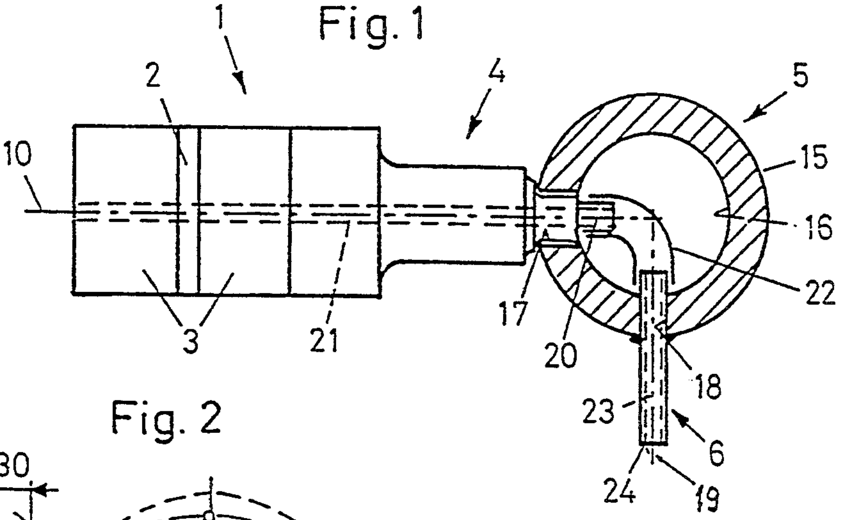
FIG. 1 is a schematic sectional view of a sonotrode with attached vibration exciter and tool.

The ultrasonic machining device according to FIG. 1 comprises a vibration exciter 1 with a piezo quartz thickness vibrator 2 and two metal cylinders 3 whose faces are connected to the vibrator, an amplifier or booster 4, a sonotrode 5 and a tool 6. The vibration exciter is cylindrical and performs harmonic longitudinal vibrations along its axis 10 with a nodal surface in its axial longitudinal center. The maximum amplitude occurs at the end faces of the vibration exciter 1. The thicker face of the coaxial amplifier 4, which is designed as a body of revolution, is attached to the one end face. The amplifier 4 tapers off in the direction of its other face and also oscillates at its natural frequency longitudinally around a nodal surface. The vibration amplitude is amplified by means of the tapering.

The sonotrode 5 is designed as an annular bending vibrator with a cylindrical outer surface 15, a coaxial, cylindrical inner surface 16, and an axis 11. The thinner end of the amplifier 4 is screwed into an input 17 of the sonotrode, the input being designed as an internal thread. The input 17 is coaxial to the axis 10 and radial to the cylindrical outer surface 15. The output 18 of the sonotrode 5 is designed as a bore, in which the tool 6, which is tubular here, is firmly connected (e.g. soldered in). The output axis 19 is also radial and intersects the input axis 10 forming an angle of about 90°. A coaxial tube 20, which communicates with a bore 21, penetrating the vibration exciter 1 and the amplifier 4, is moulded to the sonotrode. The tube 20 is connected to the axial bore 23 of the tool 6 by way of a hose 22. During ultrasonic machining, abradant can be drawn off through the bore 21, the hose 22 and the hollow tool 6 from the face 24 of the tool 6, acting as the working face, or the abradant can be supplied to the face 24.

Figure 2:
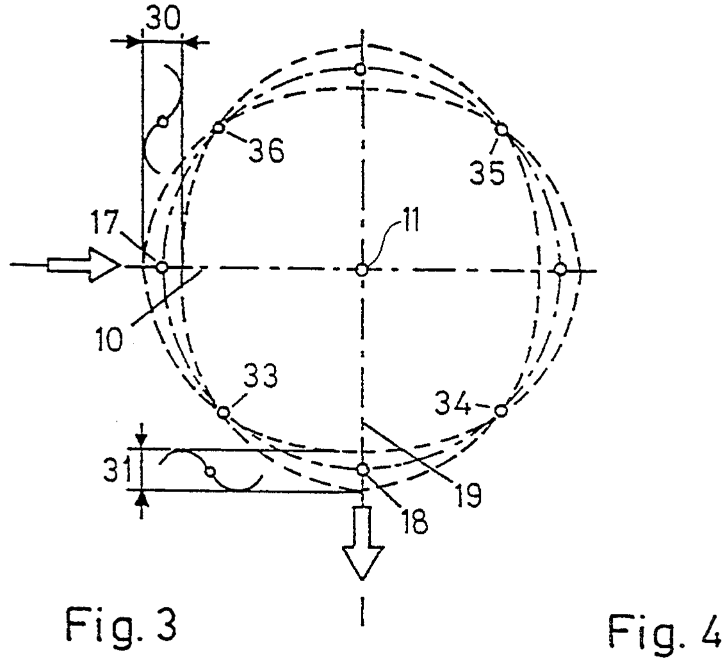
FIG. 2 is a representation of the vibration of the sonotrode.

The natural bending frequency of the sonotrode 5 is equal to the natural longitudinal vibration frequency of the amplifier 4 and the vibration exciter 1. The sonotrode vibrates around four nodal points 33 to 36. FIG. 2 shows the vibration of the neutral fibers of the sonotrode. When the cross section of the sonotrode 5 is the same over its entire circumference, the output amplitude 31 of the sonotrode vibration is equal to the input amplitude 30 (except for friction loss). As is evident, the output amplitude is at its maximum when the output axis 19 is at a right angle to the input axis 10, although the output amplitude is still near the maximum value when the angle deviates slightly, e.g. ±20° between 70° and 110°.

Figure 3:
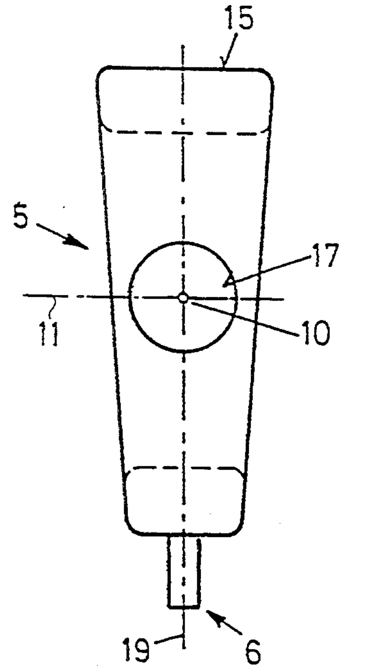
FIG. 3 is a side view of the sonotrode.

It is especially advantageous if the cross section of the sonotrode 5 increases from the output 18 in the direction of both sides up to the diametrically opposite point, as depicted in FIG. 3. The sonotrode thus projects conically in the direction of the input axis 10. With such a configuration the sonotrode also acts as an amplifier, and the output amplitude 31 is greater than the input amplitude 30.

Figure 4:
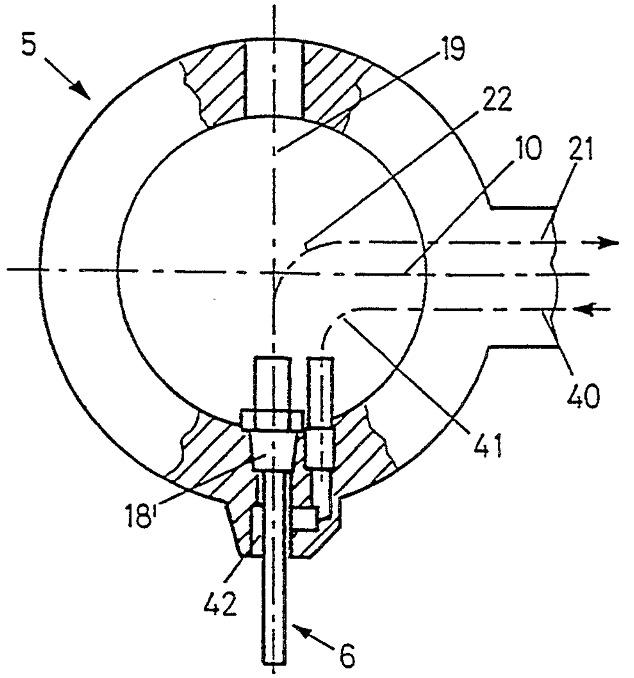
FIG. 4 is a variation of the sonotrode.

FIG. 4 shows a variation where the tool 6 is detachably connected to the sonotrode, e.g. screwed from the top into a female thread 18'. As is apparent from FIG. 4, abradant can also be supplied by way of an additional bore 40 in the amplifier 4, another hose 41 and a ring nozzle 42 enveloping the tool 6.

The goal is reached with the sonotrode 5 designed according to the invention as an annular bending vibrator that the tool 6 vibrates at an angle to the axis 10 of the vibration exciter 1 and the amplifier 4. Thus, even difficult to access workpieces can be machined efficiently with ultrasonics.

If the tool 6 is also to vibrate laterally relative to the longitudinal vibrations, it can be bent away from its axis.

Under some circumstances other natural bending vibrations with more than four nodes are also suitable for the sonotrode 5. In this case the angle at which the axes 10, 19 intersect is not 90°. For six nodes, for example, the axes 10, 19 could intersect a about 120°.

We claim:

1. An annular sonotrode (5) for an ultrasonic machining device, and having a sonotrode axis (11), the sonotrode comprising: an input means (17) for attachment of a vibration exciter (1,4) and for vibration along an input axis (10) which is perpendicular to the sonotrode axis, and an output means (18) for attachment of a tool (6) and for vibration along an output axis (19) which is perpendicular to the sonotrode axis, wherein the sonotrode is configured as a bending vibrator having a natural mode of vibration including at least two nodes (33–36) and a corresponding number of intermediate regions of maximum amplitude, the input means (17) being connected to a first one of said intermediate regions and the output means (18) being connected to a second one of said intermediate regions such that the output means vibrates along the output axis when the input means is excited at a natural frequency of the sonotrode along the input axis, and wherein the input axis and the output axis are radially oriented, intersect at a non-zero angle, and lie in a common plane of the annular sonotrode.

2. A sonotrode, as claimed in claim 1, wherein a length thereof, in axial cross-section, increases continuously from the output means up to a diametrically opposite point.

3. A sonotrode, as claimed in claim 2, defining a circular-cylindrical outer surface (15) and a coaxial, circular-cylindrical inner surface (16).

4. A sonotrode, as claimed in claim 2, defining a conical projection parallel to the input axis (10).

5. A sonotrode, as claimed in claim 1, wherein the input axis and the output axis intersect at an angle ranging from 70° to 110°.

6. A sonotrode, as claimed in claim 5, further comprising a ring nozzle (42) coaxial to the output means for the supply of an abradant.

* * * * *